(12) United States Patent
Torres Escajadillo et al.

(10) Patent No.: US 7,692,889 B2
(45) Date of Patent: Apr. 6, 2010

(54) SYSTEM AND METHOD FOR PROVIDING A PULSE-WIDTH MODULATED SIGNAL TO AN OUTPUT SYSTEM

(75) Inventors: William Martin Torres Escajadillo, Dallas, TX (US); Pankaj Pandey, McKinney, TX (US); Reza Sharifi, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 70 days.

(21) Appl. No.: 12/173,488

(22) Filed: Jul. 15, 2008

(65) Prior Publication Data

US 2010/0013569 A1     Jan. 21, 2010

(51) Int. Cl.
G11B 21/00 (2006.01)
G11B 21/02 (2006.01)
G11B 21/12 (2006.01)
(52) U.S. Cl. .......................................... 360/75; 360/69
(58) Field of Classification Search ......... 332/109–111; 360/69, 75
See application file for complete search history.

(56) References Cited

U.S. PATENT DOCUMENTS

| 6,175,456 | B1 | 1/2001 | Yun |
| 7,088,178 | B1 | 8/2006 | Rosenfeld et al. |
| 7,492,219 | B1 * | 2/2009 | Cyrusian ..................... 330/10 |
| 2008/0024915 | A1 | 1/2008 | Miyake et al. |

* cited by examiner

Primary Examiner—David Mis
(74) Attorney, Agent, or Firm—Dawn V. Stephens; Wade James Brady, III; Frederick J. Telecky, Jr.

(57) ABSTRACT

Systems and methods are disclosed that can be used to control an output signal, such as for controlling a heater for a hard disk drive. A system can include a pre-driver configured to provide a pulse-width modulated (PWM) signal to an output system in response to a control signal and a feedback signal, the output system being configured to provide an output signal for driving a load, the pre-driver comprising a modulator that provides the PWM signal in response to the control signal and a filtered feedback signal. A low pass filter is configured to receive a feedback signal with a voltage corresponding to a voltage of the output signal, wherein the low pass filter provides the filtered feedback signal that controls a frequency of the PWM signal to the modulator, the low pass filter having a bulk driven operational transconductance amplifier.

20 Claims, 5 Drawing Sheets

US 7,692,889 B2

SYSTEM AND METHOD FOR PROVIDING A PULSE-WIDTH MODULATED SIGNAL TO AN OUTPUT SYSTEM

TECHNICAL FIELD

This invention relates to systems and methods for providing a signal to an output system, and more specifically, to systems and methods for providing a pulse-width modulated signal to an output system.

BACKGROUND

A hard disk drive (HDD) includes a magnetic disk drive and a magnetic head in which an element portion including a reproducing element and a recording element is attached to a slider. The element portion can reproduce and/or record data in a state wherein the element flies over a magnetic disk. In such a HDD, it is required to adjust the height (hereinafter, referred to as a flying height of the element) of the element (hereinafter, referred to as a fly element) of the magnetic head in a flying state from the magnetic disk to prevent the fly element from contacting the magnetic disk.

A coil can be employed in the fly element to generate heat by iron loss or copper loss. For example, when a current is applied to the coil, the fly element heats up and expands. Proper adjustment of the temperature of the fly element can prevent the fly element from contacting the magnetic disk.

SUMMARY

One aspect of the invention provides a system that can include a pre-driver configured to provide a pulse-width modulated (PWM) signal to an output system in response to a control signal and a feedback signal, the output system being configured to provide an output signal for driving a load, the pre-driver comprising a modulator that provides the PWM signal in response to the control signal and a filtered feedback signal. A low pass filter is configured to receive a feedback signal with a voltage corresponding to a voltage of the output signal, wherein the low pass filter provides the filtered feedback signal that controls a frequency of the PWM signal to the modulator, the low pass filter having a bulk driven operational transconductance amplifier.

Another aspect of the invention provides a heater control system for a hard disk drive (HDD). The system includes a fly element that has a flying height relative to a magnetic disk that is adjustable based on a temperature of the fly element. A controller monitors the temperature of the fly element and provides an enable signal that varies according to the temperature of the fly element. A comparator that provides a first pulse width modulated (PWM) signal based on a comparison of a reference voltage and a filtered feedback signal having a voltage corresponding to an average voltage of an output PWM signal. A driver is configured to generate the output PWM signal based on the first PWM signal and in response to the enable signal, the driver providing the output PWM signal to generate a current through the fly element to adjust the temperature of the fly element.

Still another aspect of the invention provides a method for controlling an output pulse-width modulated (PWM) signal that is provided to an output for heating a fly element in a hard disk drive (HDD). The method includes providing a control signal to a modulator of a pre-driver for controlling temperature of the fly element and generating a first PWM signal based on the control signal and a filtered feedback signal. The output PWM signal is generated by a driver and provided to the output load. A feedback signal corresponding to the generated PWM signal is provided to a low pass filter. The low pass filter comprises a bulk-driven transconductance operational amplifier. The feedback signal is filtered with the bulk-driven transconductance operational amplifier to provide the filtered feedback signal.

DETAILED DESCRIPTION

The present invention relates to an approach for providing a pulse-width modulated (PWM) signal from an integrated circuit (IC) chip to an output load, such as a fly element of a hard disk drive (HDD). For example, the IC chip can be constructed to include circuitry configured to control a frequency and/or pulse-width of the PWM signal based on an input signal from a controller. Additionally, the IC chip can be constructed to set a specific slew rate for the PWM signal. To generate the PWM signal, the IC chip can be constructed to include a low pass filter that can filter a feedback signal to provide a filtered feedback signal with a voltage that is substantially proportional to an average voltage of the PWM signal.

Figure 1:
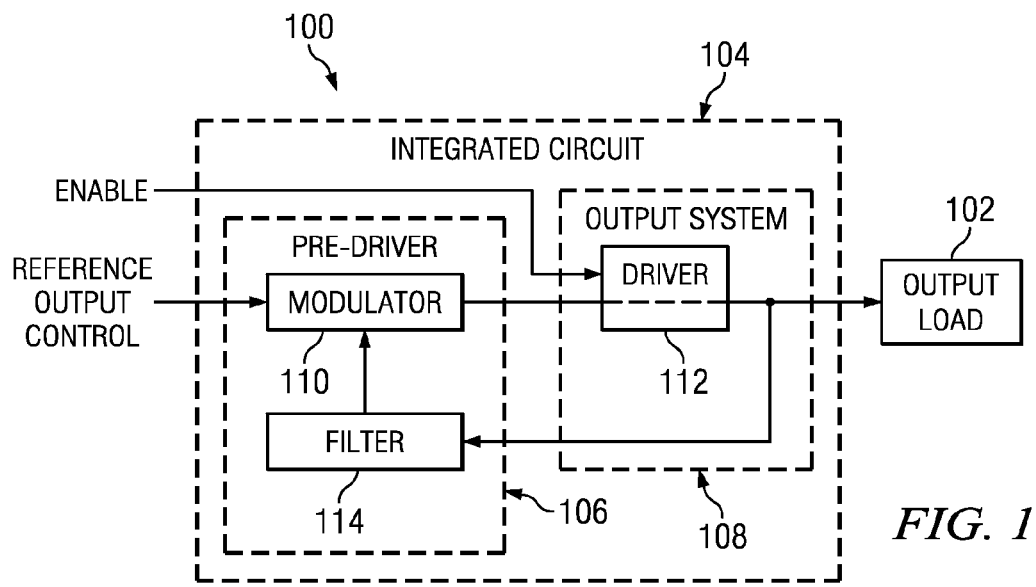
FIG. 1 illustrates a block diagram of a system for providing a PWM signal in accordance with an aspect of the invention.

FIG. 1 illustrates a system 100 for providing an output PWM signal to an output load 102 in accordance with an aspect of the invention. The system 100 can be implemented, for example, as part of a HDD. For instance, the output load 102 can be implemented as a fly element of the HDD. The fly element can, for example, read and/or write data from a magnetic disk (e.g., a platter) of the HDD. Typically, the fly element and the magnetic disk are separated by a distance that can be referred to as a "flying height" of the fly element. The fly element can include, for example, a coil for conducting current. Conduction of current through the fly element can, for example, adjust the temperature of the fly element. Adjustment of the temperature of the fly element changes the flying height of the fly element.

The system 100 can include an IC chip 104 that includes a pre-driver 106 and an output system 108, wherein the pre-driver 106 provides a first PWM signal to the output system 108. The pre-driver 106 can include, for example, a modulator 110 that receives a reference output control signal. The reference output control signal can be provided, for example, from an external source (not shown), such as a microcontroller, an application specific integrated circuit (ASIC), or the like, associated with the HDD. The reference output control can be implemented, for example, as a signal that controls a pulse width of the first PWM signal. The first PWM signal can be provided to the output system 108. The output system 108 can include, for example, a driver 112 that is configured to generate the output PWM signal based on the first PWM signal. The driver 112 can also receive an enable signal from an external source, such as the aforementioned microcontroller or ASIC. The enable signal causes the driver 112 to generate the output PWM signal and provide the output load 102 with the output PWM signal. Additionally, the driver 112 can be configured to provide the output PWM signal (or a signal proportional to such signal) to a filter 114 in the pre-driver 106 as a feedback signal.

The filter 114 can be implemented, for example, as a low pass filter with a cutoff frequency of about 1 kilohertz (kHz) or less (e.g., about 950 Hz). The filter 114 can have an RC time constant, for example, of about 1.989. The filter 114 could be implemented to provide a transconductance of about 100 nanosiemens (nS) with an input current of about 125 nanoamperes (nA) and an input voltage between about 0 Volts (V) and about 1.2 V. To achieve the desired characteristics, the filter 114 could be implemented, for example, to include a bulk-driven operational transconductance amplifier (OTA). The filter 114 can provide an output signal to the modulator 110 that is approximately proportional to an average voltage provided to the output load 102. The precision of the proportionality will depend, for example, on process variations and other constraints associated with the design and fabrication of the filter 114.

The system 100 can be employed to control a current through the output load 102 that controls a temperature of the output load 102. This may be accomplished, for example, by controlling a frequency and/or pulse-width of the output PWM signal provided from the driver 112 to the output load 102. Controlling the temperature of the output load 102 (e.g., a fly element) allows the system 100 to prevent the fly element of a hard drive from contacting (e.g., crashing) a magnetic disk.

Figure 2:
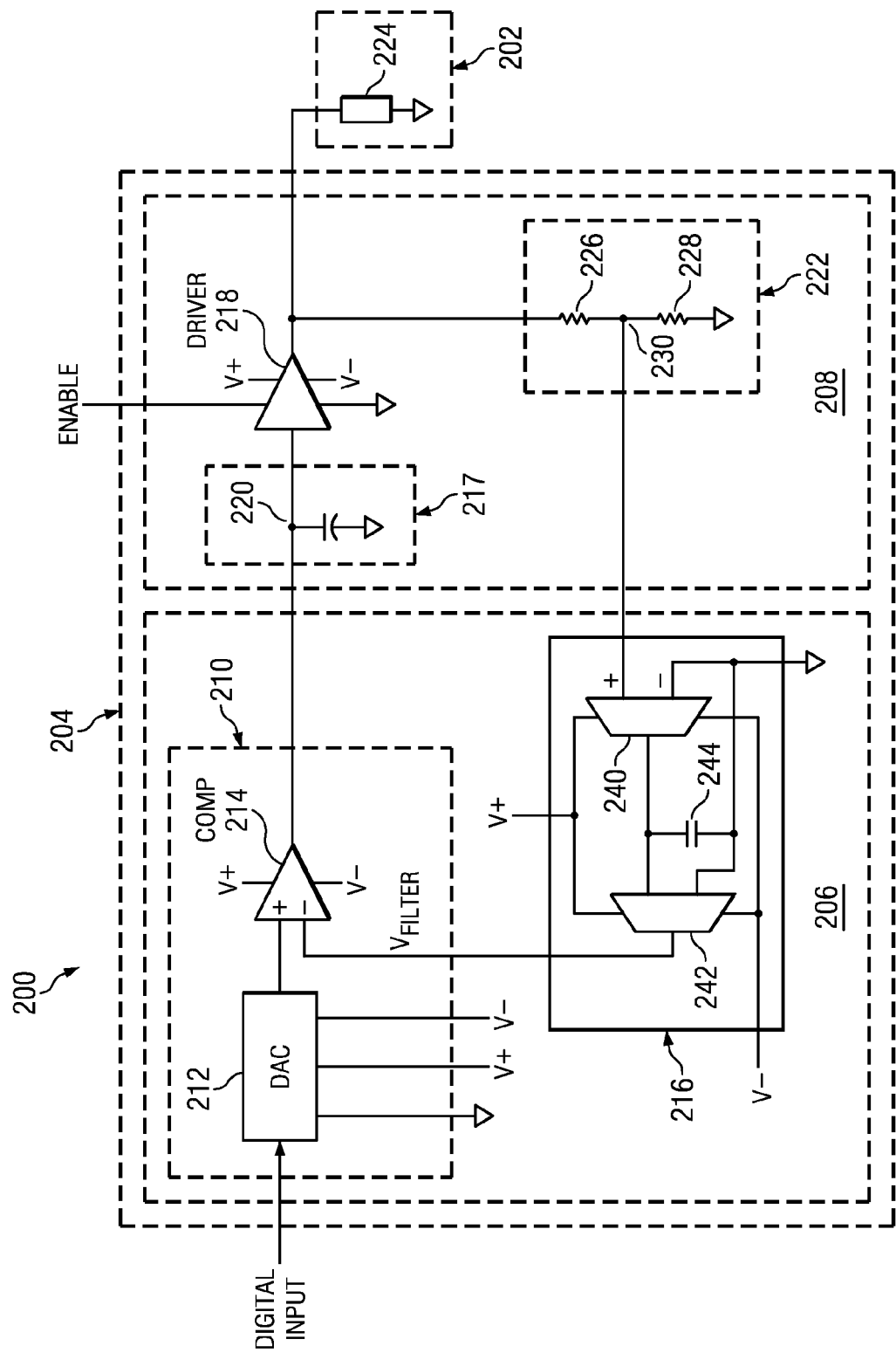
FIG. 2 illustrates a circuit diagram of a system for providing a PWM signal in accordance with an aspect of the invention.

FIG. 2 illustrates a circuit diagram of a system 200 in accordance with an aspect of the invention. The system 200 can be employed to provide an output PWM signal to an output load 202. The system 200 can include an IC chip 204. The IC chip 204 can include a pre-driver 206 and an output system 208. The pre-driver 206 can be configured to provide the output system 208 with a first PWM signal.

The pre-driver 206 receives a digital input signal at a modulator 210 that includes a DAC 212. The digital input signal can be implemented as a digital signal with 6 bits of resolution (e.g., 64 discrete values), although one skilled in the art will appreciate that a digital signal with more or less bits of resolution could also be employed. The DAC 212 can also be coupled to a high voltage level, indicated at V+. The high voltage level can be, for example, about 3V to about 5 V. The DAC 212 can also be coupled a low voltage level, indicated at V−, that can be implemented as a voltage, for example, of about −3V to about −5 V, or some other voltage level less than V+. Furthermore, the DAC 212 can be coupled to an electrically neutral point, (e.g., 0 V). One skilled in the art will appreciate that other voltage levels could also be employed.

The DAC 212 can provide a direct current (DC) analog output signal with a voltage corresponding to a value provided by the digital input signal provided from an external system (not shown), such as a microcontroller or an ASIC. The DC output signal can be provided as a reference voltage to a non-inverting positive terminal of a comparator 214 in the modulator 210. The comparator 214 also receives an output signal ($V_{FILTER}$) from a low pass filter 216 of the pre-driver 206 at an inverting negative terminal of the comparator 214. The comparator 214 can also be coupled to V+ and V−. The comparator 214 can output the first PWM signal derived from the reference signal from the DAC 212 and $V_{FILTER}$ from the low pass filter 216. The comparator 214 can provide its output to the output system 208.

The output system 208 can include a capacitive load 217 and a driver 218. The capacitive load 217 can be implemented, for example, as a capacitor that can be coupled between a node corresponding to an output of the comparator 214 and an input of the driver 218 (the node indicated at 220) and an electrically neutral second node (e.g., ground). The driver 218 receives the first PWM signal provided by the comparator 214. The driver 218 can also receive an enable signal that activates the driver 218. Additionally, the driver 218 can be coupled to V+ and V−. If the driver 218 receives the enable signal (e.g., the driver 218 is activated), the driver 218 can generate the output PWM signal based on the first PWM signal provided by the comparator 214. Moreover, the capacitive load 217 controls a slew rate of the output PWM signal by controlling the rate of charge and discharge at the input terminal of the driver 218. The output PWM signal can be provided to an output load 202 and a voltage divider 222. As an example, the output system 208 can be configured to provide a PWM signal (e.g., the output PWM signal) with a slew rate of about 1 V/microsecond at a frequency of about 1 kHz or less.

The output load 202 can correspond to a fly element of a HDD. In such an implementation, the fly element can, for example, read and/or write data from a magnetic disk (e.g., a platter) of the HDD. Typically, the fly element and the magnetic disk drive are separated by a flying height of the fly element. The fly element can include, for example, an inductive coil for conducting current. Conduction of current through the fly element can adjust the temperature of the fly element. Adjustment of the temperature of the fly element changes the flying height of the fly element. For purposes of controlling heating of the fly element, the output load 202 (e.g., the fly element) can be represented, for example, as a resistive load 224 having a resistance of about 50 to about 80 ohms. One skilled in the art will appreciate that the impedance load 224 can have both resistive and reactive components.

The voltage divider 222 can be employed to provide a voltage and/or current reduced PWM signal to the low pass filter 216 (e.g., a feedback signal). The voltage divider 222 can include first and second resistors 226 and 228; however, one skilled in the art will appreciate that more resistors could be employed in other implementations. Although in the present example, the voltage divider 222 is illustrated as being implemented in the IC chip 204, one skilled in the art will appreciate that the voltage divider 222 could alternatively be external to the IC chip 204. A first node of the first resistor 226 can be coupled to the output of the driver 218. A second node of the first resistor 226 can be coupled to a node common to a non-inverting positive input terminal of the low pass filter 216, and a first node of the second resistor 228, the node being indicated at 230 to provide a corresponding feedback signal to the low pass filter 216. A second node of the second resistor 228 can be coupled to the electrically neutral node (e.g., ground). The feedback signal provided to the non-inverting positive terminal of the low pass filter 216 thus has a voltage corresponding to the output voltage of the driver 318 according to the ratio of resistances 226 and 228 in the voltage divider 222. The first resistor 226 could be, for example, a 60 kilo-ohm resistor, and the second resistor 228 could be, for example, a 30 kilo-ohm resistor, although one skilled in the art will appreciate that other values and/or ratios of resistance could be employed to provide desired scaling of the output signal.

A negative input terminal of the low pass filter can be coupled to the electrically neutral node (e.g., ground). The low pass filter 216 filters the voltage reduced PWM signal (e.g., the feedback signal) and provides the filtered feedback signal to the comparator 214. The low pass filter 216 can be configured such that the filtered feedback signal has characteristics that resemble a DC signal with a voltage approximately proportional to an average voltage of the voltage provided to the output load 202. The low pass filter 216 can be implemented with a cutoff frequency of about 1 kHz or less (e.g., about 950 Hz). The low pass filter 216 can have an RC time constant, for example, of about 1.989. The low pass filter 216 could be implemented to provide transconductance of about 100 nS with an input current of about 125 nA and an input voltage between about 0 V and about 1.2 V. To achieve the desired characteristics (e.g., low transconductance), the low pass filter 216 could be implemented, for example, using bulk-driven OTAs. As stated herein, the low pass filter 216 can provide an output (e.g., the filtered feedback signal, $V_{FILTER}$) to the comparator 214 that is approximately proportional to an average of the voltage provided to the output load 202 by the driver 218.

If the driver 218 is activated (e.g., the driver 218 receives the enable signal) while the DC analog voltage provided by the DAC 212 is greater than the output signal provided by the low pass filter 216, the output of the comparator 214 can be about equal to the difference between the signal provided by the low pass filter 216 and the DC analog input signal. When the filtered output signal from the low pass filter 216 matches or exceeds the DC analog voltage provided by the DAC 212, the output of the comparator 214 drops to about electrically neutral (e.g., 0 V). Thus, a frequency of the first PWM signal provided by the comparator 214 (and a frequency of the output PWM signal provided by the driver 218) can be determined according to the cutoff frequency of the low pass filter 216.

By way of further example, the filter 216 can be implemented as a low pass $g_m$-C filter, which includes a pair of OTAs 240 and 242 and a capacitor 244 to provide the corresponding filter function. In the example of FIG. 2, the voltage-divided signal at node 230 provides feedback to a Vin+ input of the OTA 240, the output of which OTA is coupled to the Vin+ input of the OTA 242. The capacitor 244 is connected between the input of the OTA 242 and ground. Each of the Vin− inputs of the OTAs 240 and 242 is connected to ground. The V+ and V− voltages are connected to bias each of the OTA's. The output of the second OTA 242 provides the filtered feedback signal $V_{FILTER}$ to the inverting input of the comparator 214.

For instance, a transfer function H(s) for the filter 216 can be represented as follows:

$$H(s) = \frac{1}{s\frac{C}{g_{m1}} + \frac{g_{m2}}{g_{m1}}}$$

where:
C is the capacitance of the capacitor 244;
$g_{m1}$ is the transconductance of the OTA 240; and
$g_{m2}$ is the transconductance of the OTA 242.

Thus, the inverse of the transconductance ($g_m$) for the arrangement of OTAs 240 and 242 corresponds to a resistance, which together with the capacitance 244 provides a corresponding RC time constant for the filter 216. To obtain a filter with no signal amplification (e.g., unity gain), $g_{m1}$ can be set substantially equal to $g_{m2}$, although amplification can be provided if desired by configuring $g_{m1}$ and $g_{m2}$ to be different. As used in this context, the term "substantially equal" means that there can be some amount of deviation between the transconductance, such as may arise due to fabrication or process variations. The capacitor 244 can have a capacitance (e.g., about 20 picofarads (pF)) such that the low pass filter can have a desired cutoff frequency (e.g., about 1 kHz or less). Those skilled in the art will appreciate that the parameters of the filter 216 can be configured according to design and application requirements.

The system 200 could be employed to control the temperature of the output load 202. This can be accomplished, for example, by controlling a frequency, pulse-width and slew rate of the output PWM signal provided from the driver 218 to the output load 202. As discussed herein, the frequency of the output PWM signal can be controlled, for example, according to the cutoff frequency of the low pass filter 216. Moreover, the pulse-width of the output PWM signal can be controlled, for example, by the digital input signal from the aforementioned external source. Furthermore, the slew rate of the output PWM signal can be controlled, for example, by changing the capacitance of the capacitive load 217. Additionally, the overall DC loop gain of the pre-driver 206 and the output system 208 also controls the frequency and the slew rate of the output PWM signal. Controlling the temperature of the output load 202 (e.g., a fly element) allows the system 200 to prevent a fly element of a HDD from contacting (e.g., crashing) with a magnetic disk of the HDD.

Figure 3:
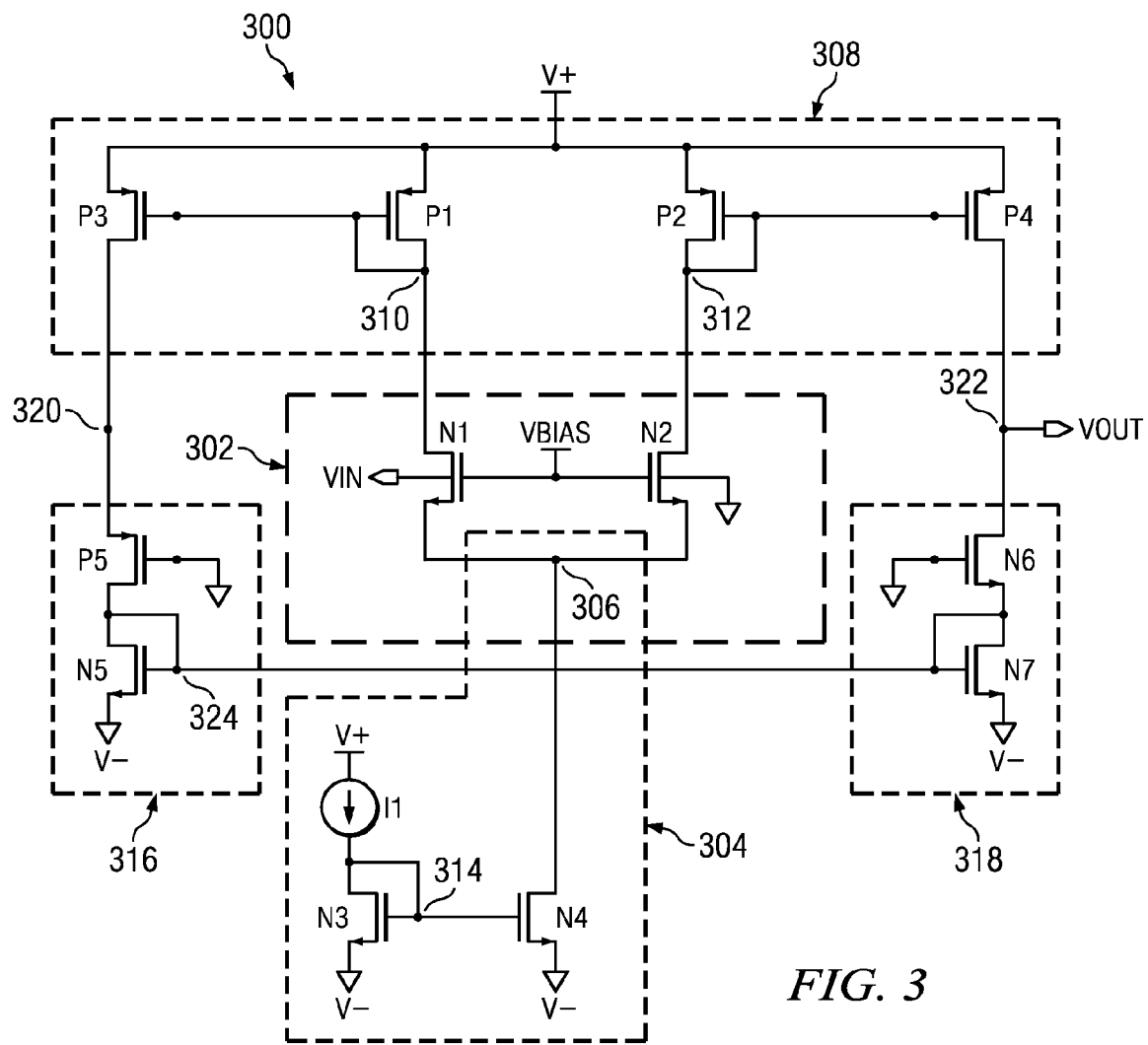
FIG. 3 illustrates a circuit diagram of an operational transconductance amplifier in accordance with and aspect of the invention.

FIG. 3 illustrates an example of a circuit diagram for an OTA 300 that can be utilized in a low pass filter (e.g., the filter 216 of FIG. 2) in accordance with an aspect of the invention. For instance, a pair of the OTAs 300 can be connected together with a capacitor, as shown in FIG. 2, to provide a low pass filter. The OTA 300 is implemented as a bulk driven single ended negative OTA. However, one skilled in the art will appreciate that other implementations are possible as well (e.g., a fully differential OTA). The OTA 300 could be fabricated, for example, using complimentary metal-oxide-semiconductor (CMOS) techniques. Moreover, in the present example, MOSFETS illustrated are assumed to have approximately equal physical dimensions (e.g., approximately equal channel widths and lengths) although one skilled in the art will appreciate that other implementations are possible as well.

The OTA 300 can receive an input signal (indicated at VIN) at a differential amplifier 302. The differential amplifier 302 can include a pair of n-channel MOSFETs (N-MOS) N1 and N2. The gate terminals of N1 and N2 can be biased by a bias voltage (VBIAS). VBIAS can drive N1 and N2 into cutoff mode. As an example, VBIAS can be a voltage of about 0.5 V. A bulk (or body) terminal of N2 can provide a negative input (VIN−) for the OTA 300, which in the example of FIG. 3 is coupled to an electrically neutral voltage (e.g., ground). However, the bulk terminal of N1 corresponds to a positive input (VIN+) of the OTA 300, which is coupled to an input VIN. A bulk terminal of a MOSFET functions similarly to a gate terminal of the MOSFET with a lower transconductance, usually denoted as $g_{mb}$. For instance, $g_{mb}$ can be about 4 to about 8 times smaller than the transconductance of the MOSFET at the gate terminal (usually denoted as $g_m$). A drain terminal of N1 can be coupled to a biasing portion 308, at a node indicated at 310. A drain terminal of N2 can also be coupled to a node of the biasing portion 308, the node indicated at 312.

The current mirror 304 can include a current source I1 that provides a substantially fixed (e.g., DC) current, for example of about 1 microampere (µA). A first node of I1 can be coupled to a positive voltage, indicated as V+. V+ can be a voltage, for example, of about 3V to about 5 V, although one skilled in the art will appreciate that V+ could be more or less. A second node of I1 can be coupled with a node common to a drain and a gate terminal of an N-MOS N3, as well as a gate terminal of another N-MOS, N4; wherein the node is indicated at 314. The source terminals of N3 and N4 can be coupled to a negative voltage, indicated as V−. V− can be a voltage, for example of about −3V to about −5V, although one skilled in the art will appreciate that V− could be any voltage less than V+. A drain terminal of N4 can be coupled to the node 306. The current mirror 304 can be configured such that the current I1 of the current supply is mirrored to N4, and pulled from the node 306.

The biasing portion 308 can include first and second p-channel MOSFETS (P-MOS) P1 and P2. Drain and gate terminals of P1 and P2 can be coupled to nodes 310 and 312, respectively. A third P-MOS, P3 can be coupled at a gate terminal to node 310. A fourth P-MOS, P4 can be coupled at a gate terminal to node 312. P1, P2, P3 and P4 can each have a source terminal coupled to V+. Additionally, P3 and P4 can have drain terminals coupled to first and second current steering portions 316 and 318, indicated at nodes 320 and 322, respectively.

The first current steering portion 316 can include a P-MOS P5 and an N-MOS N5. A source terminal of P5 can be coupled to the node 320, while a gate terminal of P5 can be at the electrically neutral point (e.g., ground). A drain terminal of P5 can be coupled to a drain and gate terminals of N5, indicated at node 324. A source terminal of N5 can be coupled to V−. The second steering portion 318 can include a two N-MOSES N6 and N7. A drain terminal of N6 can be coupled to node 322, while a gate terminal of N6 can be at the electrically neutral point (e.g., ground). A source terminal of N6 can be coupled to a drain and gate terminal of N7, which can also be coupled to node 324. A source terminal of N6 can be coupled to V−. Moreover, an output terminal, indicated at VOUT (e.g., corresponding to a negative output), for the OTA 300 can be coupled to node 322 between P4 and N6. Alternatively, the node 320 can be utilized as the output (e.g., corresponding to a positive output).

The OTA 300 can be configured such that the differential amplifier 302 can be biased by the current mirror 304. The current drawn by N4 from node 306 is about equal to sum of the drain to source currents of N1 and N2. The difference between the drain to source currents of N1 and N2 increases as VIN increases, since N2's bulk terminal is connected to the electrical neutral point. As the drain to source current N1 increases (in relation to the drain to source current of N2), the current between the drain terminal of P3 and the source terminal of P5 increases proportionally. Additionally, as the drain to source current of N2 decreases (in response to the drain to source current of N1 increasing), the current between the drain terminals of P4 and N6 decreases proportionally, thereby increasing the voltage at VOUT. Thusly, increasing VIN causes a corresponding increase in VOUT.

Moreover, since the OTA 300 is configured as a bulk driven single ended negative OTA, OTA 300 can exhibit a very small transconductance, such as about 100 nS or less. Furthermore, due to the capacitive effects of MOSFETS, the output at VOUT can be about equal to an average voltage at VIN.

Therefore, a low pass filter implemented using a two matched OTAs of the type of OTA 300 (e.g., as shown and described with respect to FIG. 2) enable the resulting low pass filter to have a cutoff frequency of about 1 kHz or less.

Figure 4:
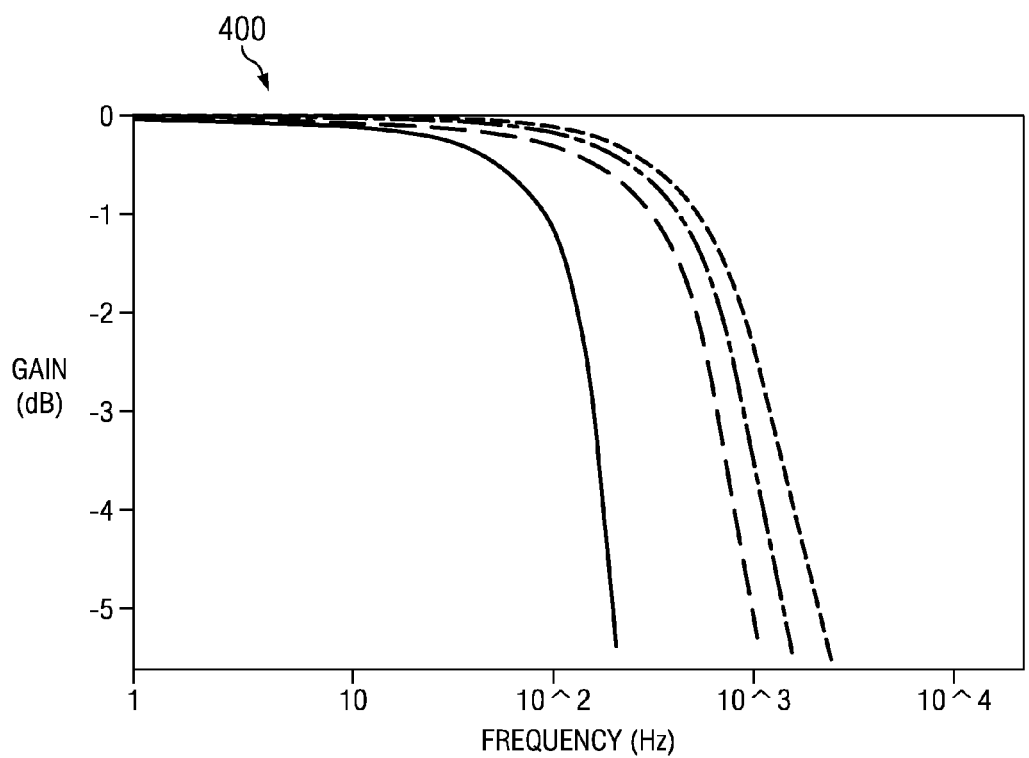
FIG. 4 illustrates a frequency response graph of a low pass filter in accordance with an aspect of the invention.

FIG. 4 illustrates a simulation of a frequency response graph 400 for a low pass filter (e.g., the low pass filter 216 illustrated in FIG. 2) in accordance with an aspect of the invention. In FIG. 4, a gain magnitude (in decibels) of the low pass filter is plotted as a function of frequency in Hz. The simulated frequency response graph 400 includes four frequency response curves that represent simulated operating conditions for the low pass filter at corners of manufacturing processes, supply voltages and temperature variations. As shown, the cutoff frequency of the low pass filter can vary from about 300 Hz to about 1100 Hz. Additionally, as illustrated in FIG. 4, the low pass filter adds almost no gain, such that the output of the low pass filter is near unity gain (e.g., 0 decibels) below the cutoff frequency for all illustrated input values. Consequently, when implemented in the system 200 illustrated in FIG. 2, the filtered output signal ($V_{FILTER}$ of FIG. 2) can provide a voltage with a very small gain (relative to VIN) to the comparator 214.

Figure 5:
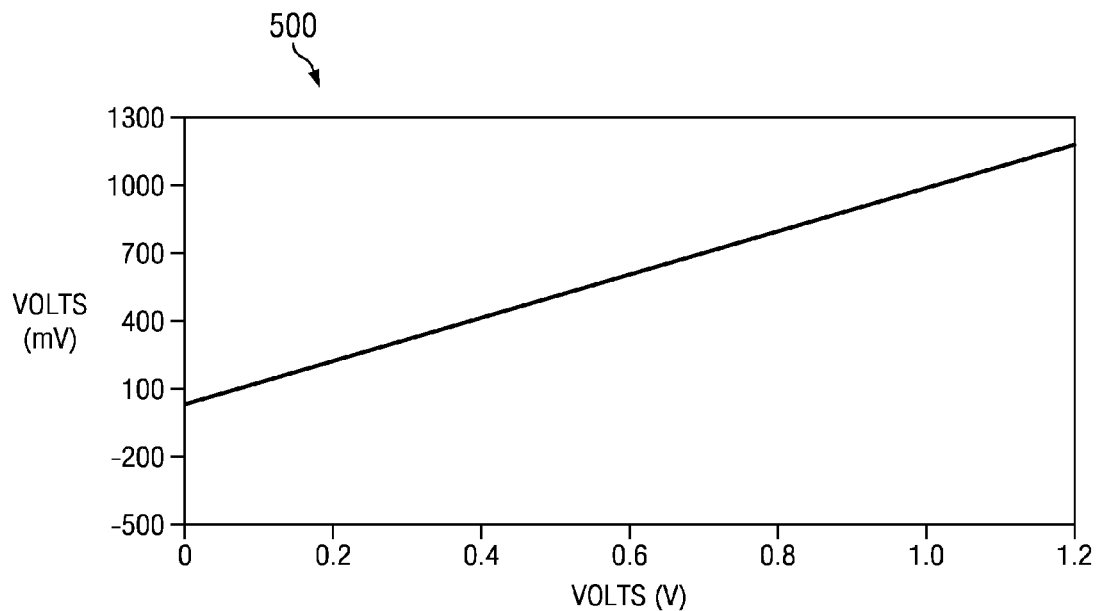
FIG. 5 illustrates a graph of an output voltage for a low pass filter in accordance with an aspect of the invention.

FIG. 5 illustrates a graph 500 of an output voltage for a low pass filter (e.g., the low pass filter 216 illustrated in FIG. 2). The output voltage, in millivolts (mV) is plotted as a function of an input voltage, in Volts (V). The output voltage has a substantially linear relationship to the input voltage from about 0 V to about 1.2 V. Specifically, the output voltage ranges from about 0 V (at an input voltage of about 0 V) to about 1200 mV (at an input voltage of about 1.2 V). Thus, as is illustrated in FIG. 5, the output voltage is substantially equal to the input voltage at a range of about 0 V to about 1.2 V. Consequently, when implemented in the system 200 illustrated in FIG. 2, the filtered output signal $V_{FILTER}$ can provide a substantially linear voltage to the comparator 214. As used in this context, the term "substantially linear" means that there can be some amount of deviation (e.g., up to about 10%) from exactly linear for the voltage relationship.

Figure 6:
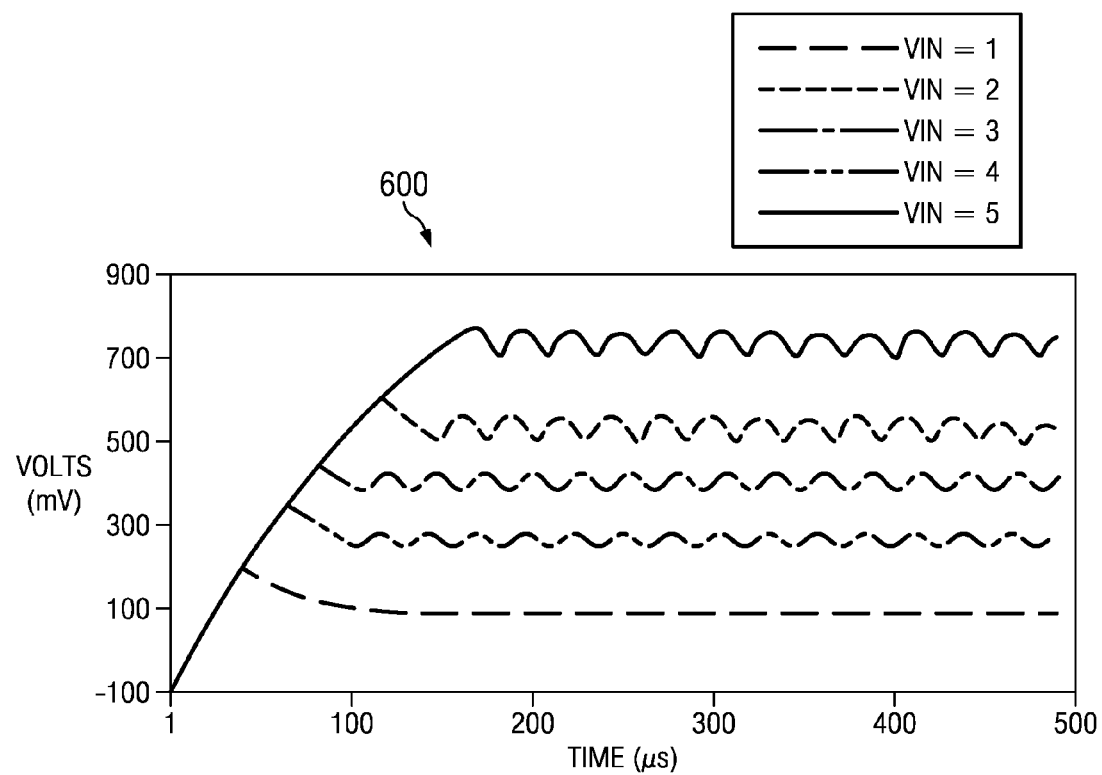
FIG. 6 illustrates a graph of transient and steady state responses for a low pass filter in accordance with an aspect of the invention.

FIG. 6 illustrates a graph 600 of transient and steady state responses of a low pass filter (e.g., the low pass filter 216 illustrated in FIG. 2) in accordance with an aspect of the invention. In FIG. 6, an output voltage of the low pass filter (in relationship to an input voltage of the low pass filter input, VIN) is plotted as a function of time in microseconds (µs). For purposes of simplification of explanation, five different values for VIN are illustrated. As is illustrated in FIG. 6, a transient response time for the low pass filter increases as VIN increases. For example, when VIN is set to about 1 V, the transient response time for the low pass filter is about 100 µs. Conversely, when VIN is set to about 5 V, the transient response time is about 180 µs. As discussed above, in the steady state response, the output voltage is about equal to an average of the input voltage provided to the filter. Consequently, when implemented in the system 200 illustrated in FIG. 2, the filtered output signal ($V_{FILTER}$) can provide a voltage with relatively constant voltage to the comparator 214.

Figure 7:
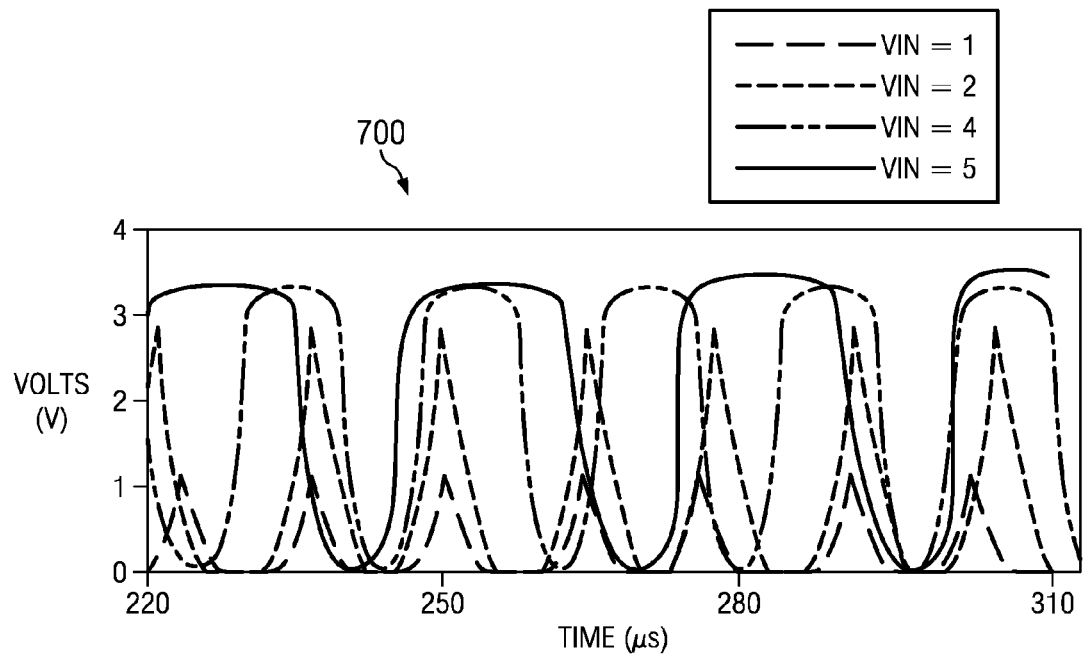
FIG. 7 illustrates a graph of pulse-width modulated signals in accordance with an aspect of the invention.

FIG. 7 illustrates a graph 700 of PWM signals that could be provided to an output load (e.g., from the IC chip 204 illustrated in FIG. 2) in accordance with an aspect of the invention. In FIG. 7, the PWM signals are plotted as a function of time in microseconds (µs). Each output corresponds to a different respective digital input (INPUT). For purposes of simplification of explanation, four different PWM signals are illustrated (e.g., for digitals inputs 1, 2, 4 and 5). As is illustrated in FIG. 7, a pulse-width for the each PWM signal increases as the value of the digital input increases. For example, when INPUT is set to 1, the pulse width for the PWM signal can be about 10 µs. Conversely, when INPUT is set to 5, the pulse width can be about 20 µs.

Figure 8:
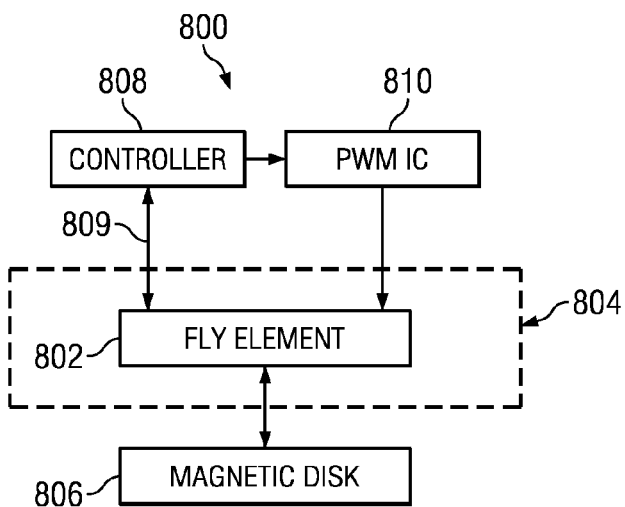
FIG. 8 illustrates a system for controlling a flying height of a fly element in a hard disk drive in accordance with an aspect of the invention.

FIG. 8 illustrates part of a HDD system 800 configured for controlling a flying height of a fly element 802 (e.g., an output load 804) for reading and/or writing data to a magnetic disk 806 (e.g., a HDD platter) of a HDD in accordance with an aspect of the invention. A controller 808 can control a position of the fly element 802 relative to the magnetic disk 806. Additionally, the controller 808 can cause the fly element 802 to read and/or write data at specific locations on the magnetic disk 806. The controller 808 can detect current and/or temperature of the fly element 802, for example, by analyzing a status signal from the fly element 802, such as schematically indicated at the signal path 809 between the controller 808 and the fly element 802. The temperature of the fly element 802 controls the distance between the magnetic disk 806 and the fly element 802, which can be referred to as the flying height.

The controller 808 can cause a PWM IC chip 810 to provide the fly element 802 with a modulated (e.g., PWM) output signal to adjust the current and/or temperature of the fly element 802. The PWM IC chip 810 could be implemented, for example, as the IC chip 204 illustrated in FIG. 2. Specifically, the controller 808 can provide a digital signal to the PWM IC chip 810 that specifies a pulse width for the PWM output signal. Additionally, the controller 808 can provide the PWM IC chip 810 with an enable signal that causes a driver of the PWM IC chip 810 to output the PWM output signal. Control of the temperature of the fly element 802 can prevent the fly element 802 from contacting (e.g., crashing) the magnetic disk 806.

Figure 9:
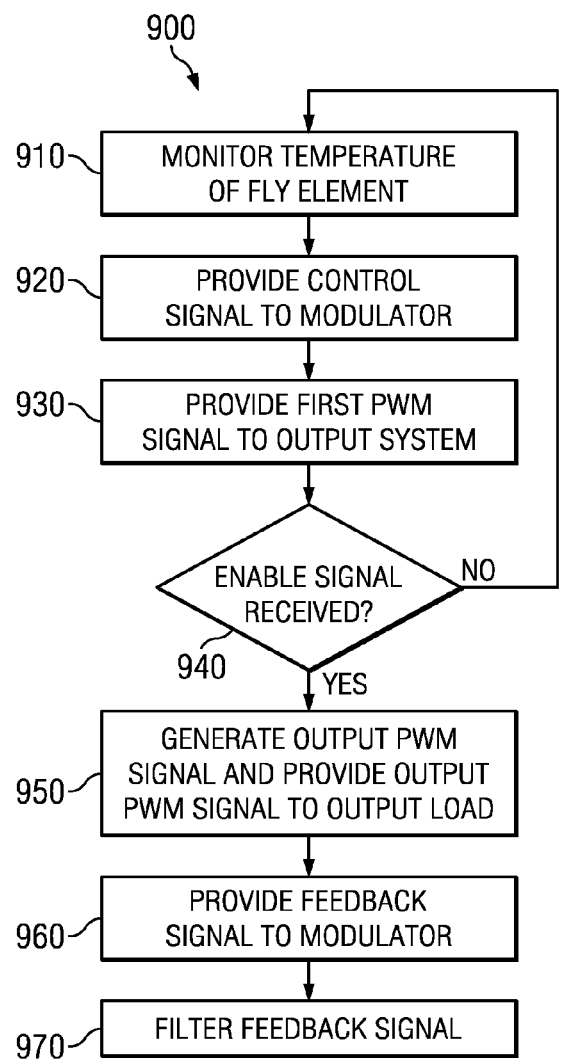
FIG. 9 illustrates a flow chart of a methodology for controlling a flying height of a fly element in accordance with an aspect of the invention.

In view of the foregoing structural and functional features described above, methodologies will be better appreciated with reference to FIG. 9. It is to be understood and appreciated that the illustrated actions, in other embodiments, may occur in different orders and/or concurrently with other actions. Moreover, not all illustrated features may be required to implement a method.

FIG. 9 illustrates a flow chart for a methodology 900 for controlling a current and/or temperature of a fly element of a hard disk according to an aspect of the invention. At 910, a current and/or temperature of the fly element can be monitored by a controller. At 920, a control signal is provided to a modulator of a pre-driver of an IC chip. At 930, the modulator provides a first PWM signal to an output system of the IC chip. The first PWM signal can be provided based on a comparison of a reference voltage relative to a feedback signal that has a voltage approximately proportional to an average voltage of an output signal of the IC chip.

At 940, a determination is made as to whether the output system of the IC chip has been enabled. The controller can provide the enable signal, for example, if the controller determines that the current and/or temperature of the fly element needs to increase. If the determination is negative (e.g., NO), the methodology returns to 910. If the determination is positive (e.g., YES), the methodology proceeds to 950.

At 950, a driver of the output system generates an output PWM signal based on the first PWM signal and provides the output PWM signal to an output load (e.g., the fly element). At 960, the driver provides a feedback signal to a low pass filter of the pre-driver. At 970, the low pass filter of the pre-driver filters the feedback signal and provides the filtered feedback signal to the modulator. The low pass filter could be implemented, for example, as including a bulk-driven OTA, such as to provide the filtered feedback signal that is approximately proportional to an average of the output PWM signal (provided at 950).

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the scope of the appended claims.

What is claimed is:

1. A system comprising:
a pre-driver configured to provide a pulse-width modulated (PWM) signal to an output system in response to a control signal and a feedback signal, the output system being configured to provide an output signal for driving a load, the pre-driver comprising a modulator that provides the PWM signal in response to the control signal and a filtered feedback signal; and
a low pass filter configured to receive the feedback signal with a voltage corresponding to a voltage of the output signal, wherein the low pass filter provides the filtered feedback signal that controls a frequency of the PWM signal to the modulator, the low pass filter having a bulk driven operational transconductance amplifier.

2. The system of claim 1, wherein:
the PWM signal is a first PWM signal;
the output signal is an output PWM signal; and
the output system provides the output PWM signal as to a fly element of a hard disk drive.

3. The system of claim 2, further comprising a controller that provides an enable signal to the output system based on a temperature of the fly element, wherein the output system provides the output PWM signal in response to the enable signal.

4. The system of claim 2, wherein the low pass filter provides the filtered feedback signal with a magnitude corresponding to an average voltage applied to the fly element by the output system.

5. The system of claim 1, wherein:
the PWM signal is a first PWM signal; and
the output system further comprises a driver configured to provide the output signal as a modulated output signal to an output load in response to an enable signal.

6. The system of claim 5, wherein the output system further comprises a voltage divider that divides the output signal as to provide the feedback signal to the low pass filter.

7. The system of claim 6, wherein the low pass filter has a cutoff frequency of about 1 kilohertz or less.

8. The system of claim 6, wherein the low pass filter provides the filtered feedback signal with a magnitude substantially proportional to an average voltage of the modulated output signal.

9. The system of claim 8, wherein the pre-driver further comprises:
a digital-to-analog converter that receives the control signal as a digital input signal and outputs an analog reference signal based on the control signal; and
a comparator that compares the analog reference signal to the filtered feedback signal and provides the first PWM signal to the driver of the output system based on the comparison.

10. The system of claim 5, wherein the filtered feedback signal has a substantially linear gain in relation to the feedback signal provided to an input of the low pass filter.

11. The system of claim 1, wherein the pre-driver and the output system are implemented on an integrated circuit (IC) chip.

12. A heater control system for a hard disk drive (HDD) comprising:
- a fly element that has a flying height relative to a magnetic disk that is adjustable based on a temperature of the fly element;
- a controller that monitors the temperature of the fly element and provides an enable signal that varies according to the temperature of the fly element;
- a comparator that provides a first pulse width modulated (PWM) signal based on a comparison of a reference voltage and a filtered feedback signal having a voltage corresponding to an average voltage of an output PWM signal; and
- a driver configured to generate the output PWM signal based on the first PWM signal and in response to the enable signal, the driver providing the output PWM signal to generate a current through the fly element to adjust the temperature of the fly element.

13. The system of claim 12, further comprising a low pass filter configured to filter a feedback signal provided from the driver, and to provide the filtered feedback signal to the comparator, wherein the feedback signal has a voltage corresponding to the voltage of the output PWM signal.

14. The system of claim 13, further comprising a digital-to-analog converter that provides the reference voltage in response to a digital input signal from the controller.

15. The system of claim 13, wherein the low pass filter further comprising a bulk-driven transconductance operational amplifier.

16. The system of claim 15, wherein the low pass filter has a cutoff frequency of about 1 kilohertz or less.

17. A method for controlling an output pulse-width modulated (PWM) signal provided to an output for heating a fly element of a hard disk drive (HDD), the method comprising:
- providing a control signal to a modulator of a pre-driver for controlling temperature of the fly element;
- generating a first PWM signal based on the control signal and a filtered feedback signal;
- generating the output PWM signal based on the first PWM signal to provide the output PWM signal to the output;
- providing a feedback signal corresponding to the output PWM signal to a low pass filter, the low pass filter comprising a bulk-driven transconductance operational amplifier; and
- filtering the feedback signal with the bulk-driven transconductance operational amplifier to provide the filtered feedback signal.

18. The method of claim 17, further comprising the fly element of the hard disk drive coupled to the output, the method further comprising:
- monitoring a temperature of the fly element; and
- providing an enable signal to the output system that varies based on the monitored temperature.

19. The method of claim 18, wherein the output PWM signal is provided to the output in response to the enable signal.

20. The method of claim 17, wherein the low pass filter has a cutoff frequency of about 1 kilohertz or less.

* * * * *